(12) United States Patent
Bickel

(10) Patent No.: US 7,526,391 B2
(45) Date of Patent: Apr. 28, 2009

(54) METHOD AND APPARATUS TO EVALUATE TRANSIENT CHARACTERISTICS IN AN ELECTRICAL POWER SYSTEM

(76) Inventor: Jon A. Bickel, 3123 Monarch Dr., Murfreesboro, TN (US) 37129

( * ) Notice: Subject to any disclaimer, the term of this patent is extended or adjusted under 35 U.S.C. 154(b) by 188 days.

(21) Appl. No.: 11/638,820

(22) Filed: Dec. 14, 2006

(65) Prior Publication Data

US 2008/0143315 A1    Jun. 19, 2008

(51) Int. Cl.
G01R 15/00 (2006.01)
G06F 11/00 (2006.01)

(52) U.S. Cl. .......................... 702/57; 702/61; 702/188; 702/196; 324/72

(58) Field of Classification Search ............ 702/57–59, 702/61, 64–66, 188, 183–185, 196; 324/76.12, 324/72; 398/25, 38
See application file for complete search history.

(56) References Cited

U.S. PATENT DOCUMENTS

| | | | | |
|---|---|---|---|---|
| 5,483,153 | A * | 1/1996 | Leeb et al. | 324/76.12 |
| 6,708,124 | B2 * | 3/2004 | Bilas et al. | 702/61 |
| 6,937,821 | B1 * | 8/2005 | Heath et al. | 398/38 |
| 7,272,518 | B2 | 9/2007 | Bickel et al. | 702/61 |
| 2001/0024115 | A1 | 9/2001 | Medelius et al. | 324/72 |

OTHER PUBLICATIONS

"Power Xpert® 4000/6000/8000 Meters," Eaton Electrical Inc., Copyright © 2001-2007; http://www.eatonelectrical.com/NASApp/cs/ContentServer?GXHC_GX_jst=c7014444662d6165&G . . . 3 pages.
"Power Xpert® 4000/6000/8000 Power Quality Meters, Product Focus," Eaton Electrical Inc., Copyright © 2007, 8 pages.
"Next-Generation Power Quality Meters," Eaton Cutler-Hammer White Paper, Eaton Corporation, dated Jan. 2006, 12 pages.
"Power XPert® 4000/6000/8000 Power Quality Meters, Technical Data," Eaton Electrical Inc., Copyright © 2007, 12 pages.
"ION 7650 Intelligent Metering And Control Device," Power Measurement © 1992-2007, http://www.pwrm.com/products/ION7650/, 2 pages.
"ION 7650 Features Summary," Power Measurement © 1992-2007, http://www.pwrm.com/products/ION7650/features/, 2 pages.
"ION 7650 Applications Summary," Power Measurement © 1992-2007, http://www.pwrm.com/products/ION7650/applications/, 2 pages.

(Continued)

Primary Examiner—John H Le

(57) ABSTRACT

A system and method to evaluate characteristics of transient events in an electrical power system to determine the location of a transient source type, the source type of a transient event, and suggested mitigation measures that might reduce or eliminate the effects of the transient. The electrical power system has a plurality of monitoring devices that each may detect the occurrence of a transient event incident upon the power system. A controller is coupled to the monitoring devices. The monitoring devices measure signal parameter values associated with the transient event, and the location of the transient event is automatically determined by evaluating transient characteristics from each of the recording monitoring devices. Other measurements of signal parameters may be made to determine transient characteristics. The transient characteristics may be used to determine the source of the transient event, the type of transient event, mitigation measures, and the effects or predictive effects of mitigation measures.

23 Claims, 11 Drawing Sheets

OTHER PUBLICATIONS

"Power Quality—Where did That Event Come From?" Power Logic Solutions, Square D, vol. 7, Issue 2, © 2003, Schneider Electric, 4 pages.

"PowerLogic® ION7550/ION7650 Power Energy Meters," Schneider Electric, Square D. Company, Nov. 2006, 8 pages.

"Generic Specification For High Performance Power Monitoring, Revenue Metering, Power Quality Recording, And RTU Functionality," Nexus 1250, 10 pages.

"Performance Power Meter & Data Acquisition Node," Nexus 1250 For Industry and Utilities, Accu-Measure® Technology, Electro Industries/GaugeTech, dated May 25, 2005, 16 pages.

Bickel, Jon, Square D/Schneider Electric, "Identifying Problems From Transients In Power Systems," LaVergne, TN,—Plant Engineering, Sep. 1, 2004, 6 pages.

"Transient Power Systems (Part 1 in Transient Series)," PowerLogic Solutions, vol. 6, Issue 1, Square D/Schneider Electric, dated Sep. 2002, 4 pages.

"Transient Power Systems (Part 2 in Transient Series)," PowerLogic Solutions, vol. 6, Issue 2, Square D/Schneider Electric, dated Sep. 2002, 4 pages.

Lorenzo Peretto et al.: "A Distributed Measurement System for Locating Transient-Voltage Sources" Instrumentation and Measurement Technology Conference, 6 pages (pp. 1233-1238) dated Apr. 2006.

Roberts S.A. et al.: "Detection and Classification of High Frequency Transients Using Wavelet Analysis", 6 pages (pp. 801-806vol. 2) dated 2002.

Written Opinion corresponding to co-pending International Patent Application Serial No. PCT/US2007/085513, European Patent Office, dated Sep. 9, 2008, 5 pages.

International Search Report corresponding to co-pending International Patent Application Serial No. PCT/US2007/085513, European Patent Office, dated Sep. 9, 2008, 4 pages.

\* cited by examiner

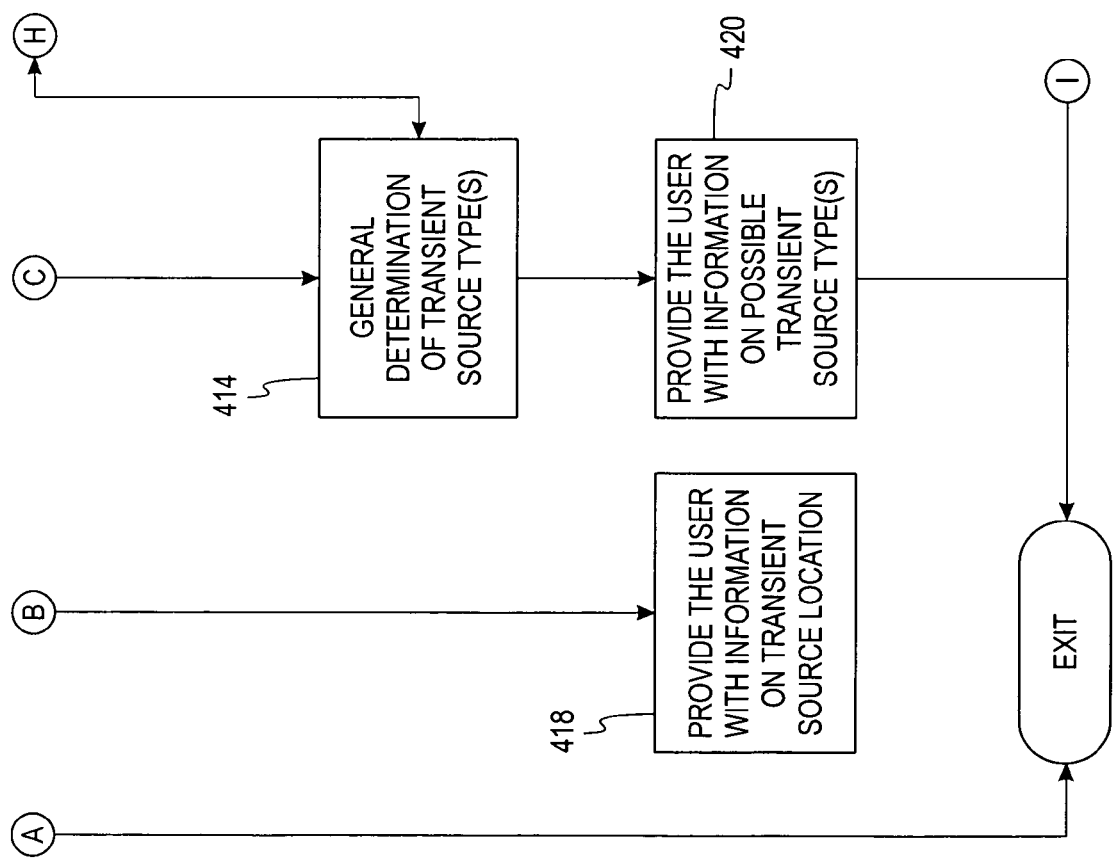

METHOD AND APPARATUS TO EVALUATE TRANSIENT CHARACTERISTICS IN AN ELECTRICAL POWER SYSTEM

FIELD OF THE INVENTION

The present invention relates generally to transient detection systems, and, in particular, to a transient evaluation system and method that automatically evaluates characteristics of a transient event.

BACKGROUND OF THE INVENTION

Sources of destructive high-speed transient events may range from a lightning stroke during a thunderstorm to an electrostatic discharge (ESD) from a human finger. High-speed electrical transient events may originate inside a facility or on the electrical grid, and may propagate through various levels of electrical and data systems. High-speed transient voltages that exceed insulation ratings may stress electrical insulation, leading to abrupt failure or gradual breakdown of the dielectric material. Industrial facilities may experience many transient events every hour, with voltage impulses exceeding 5 to 10 times the nominal system voltage. Reducing the magnitude, duration, and quantity of transient events may extend the life of equipment insulation.

Transient events typically last from less than a microsecond to several milliseconds. Transient voltages are generally classified into normal mode or common mode, depending on where they occur on a power system. Normal-mode transient voltages appear between any two power or signal conductors. Common-mode transient voltages generally appear equally and in-phase from each power or signal conductor to ground. Because the damage due to transient voltages at times is subtle, identifying transients as the cause of damage to a component is difficult, and is often diagnosed as "unknown."

The effect of a transient event on a specific load will depend on the load's level of susceptibility to transients. The influence of a transient event on electronic equipment generally falls into one of four categories: 1) intermittent interruption; 2) chronic degradation; 3) latent failure; and 4) catastrophic failure.

Intermittent interruptions may occur when a transient event is injected into a data or control network resulting in lost or corrupted data. This may result in the load or device locking up, tripping off, or operating improperly. Factors that can affect a transient's ability to disturb a load include design and operating speed of semiconductors, system filters, grounding configuration, susceptibility to electromagnetic interference (EMI) and radio frequency interference (RFI), and the configuration of the data or control cable.

Chronic degradation may occur when repetitive transient events diminish the integrity of an exposed component (or components). Over time (generally days, weeks, or even months), the cumulative effect of transient voltages results in the eventual failure of the vulnerable component.

Latent failures are similar to chronic degradation, except that they are precipitated by a significant transient event that damages components, but not to the point that the component cannot perform its intended function. Over some period of time (again, days, weeks, or even months), the ordinary stresses due to normal operation will ultimately result in the component's inoperability. Latent failures are more difficult to troubleshoot because the root cause may have occurred at any time in the past.

Catastrophic failures due to transient events cause the affected component to immediately cease to operate and damage may be visible. Catastrophic failures result from the magnitude, duration, or rate of rise of the transient exceeding the rated threshold of the component to create a permanent open circuit or short circuit within the component. Solid-state products, microprocessor-based devices, and programmable logic controllers (PLCs) are especially susceptible to damage from voltage transients. Accordingly, exposure to transient events can reduce the reliability and shorten the life of such devices. As technology evolves and the scale of these devices shrinks, their susceptibility to damage from the harmful characteristics associated with high-speed transient events increases.

High-speed transient events can interfere with the normal operation of equipment resulting in erratic behavior and the diminished quality of the equipment's end product. Furthermore, interruptions in continuous manufacturing processes can result in revenue losses due to production downtime.

Failure to take remedial action to eliminate transient events can lead to equipment failure or other anomalies such as a hard drive crash, parity errors, power supply failure, component failure, lock up, memory scramble, SCR failure, or speed or setting drift.

What is needed, therefore, is a system to allow users to determine the location of transient events in an electrical system. There is also a need for a system to determine transient characteristics data to effectively troubleshoot and remedy high-speed transient events in an electrical power system. There is a further need for a system and method to assist in determining the most effective technique to mitigate the effects of a given transient source type. There is also a need for a system to determine the effectiveness of an applied solution to detection of a transient source type. There is also a need for a system of transient detection devices installed on an electrical power system for reliable transient information. Aspects of the present invention described herein fulfills these and other needs.

SUMMARY OF THE INVENTION

Briefly, according to an aspect of the present invention, a method of determining the location of a transient event in an electrical system, includes: detecting the occurrence of the transient event at a plurality of monitoring devices arranged at multiple locations in the electrical system; measuring, in at least some of the monitoring devices, at least one characteristic of the transient event; and automatically determining the location of the transient event based on a comparison of the at least one characteristic measured by each of the monitoring devices. A computer readable medium encoded with instructions for directing a controller to perform this method. In some aspects, the method may further include measuring an electrical parameter of the transient event; and determining a characteristic of the transient event based on the measured electrical parameter.

The electrical parameter may at least one of voltage, amperage, percentage, time, frequency(s), number of occurrences, rate of change, polarity, date, phase angle, energy, effected conductor(s), shape or location. The characteristic may be at least one of peak amplitude, rise time, time of occurrence, periodicity of occurrence, frequency components, initial polarity, decay time, total duration, phase angle, energy, shape, affected conductors, cumulative energy or location.

In still other aspects, the method may further include selecting a transient mitigation device based on the characteristic of the transient event; and installing the transient mitigation device in the electrical system. It may further include evaluating the effectiveness of the transient mitigation device based on a characteristic of a subsequent transient event. In yet further aspects, the method may include measuring additional electrical parameters of the transient event; and determining additional characteristics of the transient event based on the additional measured electrical parameters. The method may further include determining the type of the transient event based on the additional characteristics. In some other aspects, the method may further include assigning the transient event to a predetermined category of transient events based on the additional characteristics. The category of transient events may be determined by collecting characteristics data from prior transient events.

According to another aspect of the present invention, a transient evaluation system to determine the location of a transient event in an electrical system, the transient evaluation system includes: a plurality of monitoring devices electrically coupled to the electrical system, the monitoring devices measuring the magnitude of the transient event; a controller in communication with the plurality of the monitoring devices, wherein the controller determines the location of the transient event based on the highest magnitude of the transient event measured by the plurality of monitoring devices. The electrical system may have a hierarchy of the plurality of monitoring devices and the controller may determine the location of the transient event by referencing the monitoring device measuring the highest magnitude with the hierarchy of the plurality of monitoring devices. The measuring devices may measure an electrical parameter of the transient event, and the controller may determine a characteristic of the transient event based on the measured electrical parameter. The electrical parameter may be at least one of voltage, amperage, percentage, time, frequency(s), number of occurrences, rate of change, polarity, date, phase angle, energy, effected conductor(s), shape or location. The characteristics may be at least one of peak amplitude, rise time, time of occurrence, periodicity of occurrence, frequency components, initial polarity, decay time, total duration, phase angle, energy, shape, affected conductors, cumulative energy or location.

According to other aspects, the controller may select a transient mitigation device for installation in the electrical system based on the characteristic of the transient event. The controller may evaluate the effectiveness of the transient mitigation device based on a characteristic of a subsequent transient event or predict the effectiveness of the transient mitigation device.

In still further aspects, at least one of the plurality of monitoring devices may measure additional electrical parameters of the transient event, and the controller may determine additional characteristics of the transient event based on the additional measured electrical parameters. The controller may determine the type of the transient event based on the additional characteristics. The controller may assign the transient event to a predetermined category of transient events based on the additional characteristics.

In some aspects, the system may further include a memory device storing the additional characteristics. The memory device may store the additional characteristics as a category according to a range of values in a matrix.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIGS. 4A-4C are flow diagrams of a process used by the evaluation system in FIG. 1 to analyze transient data;

Figure 1:
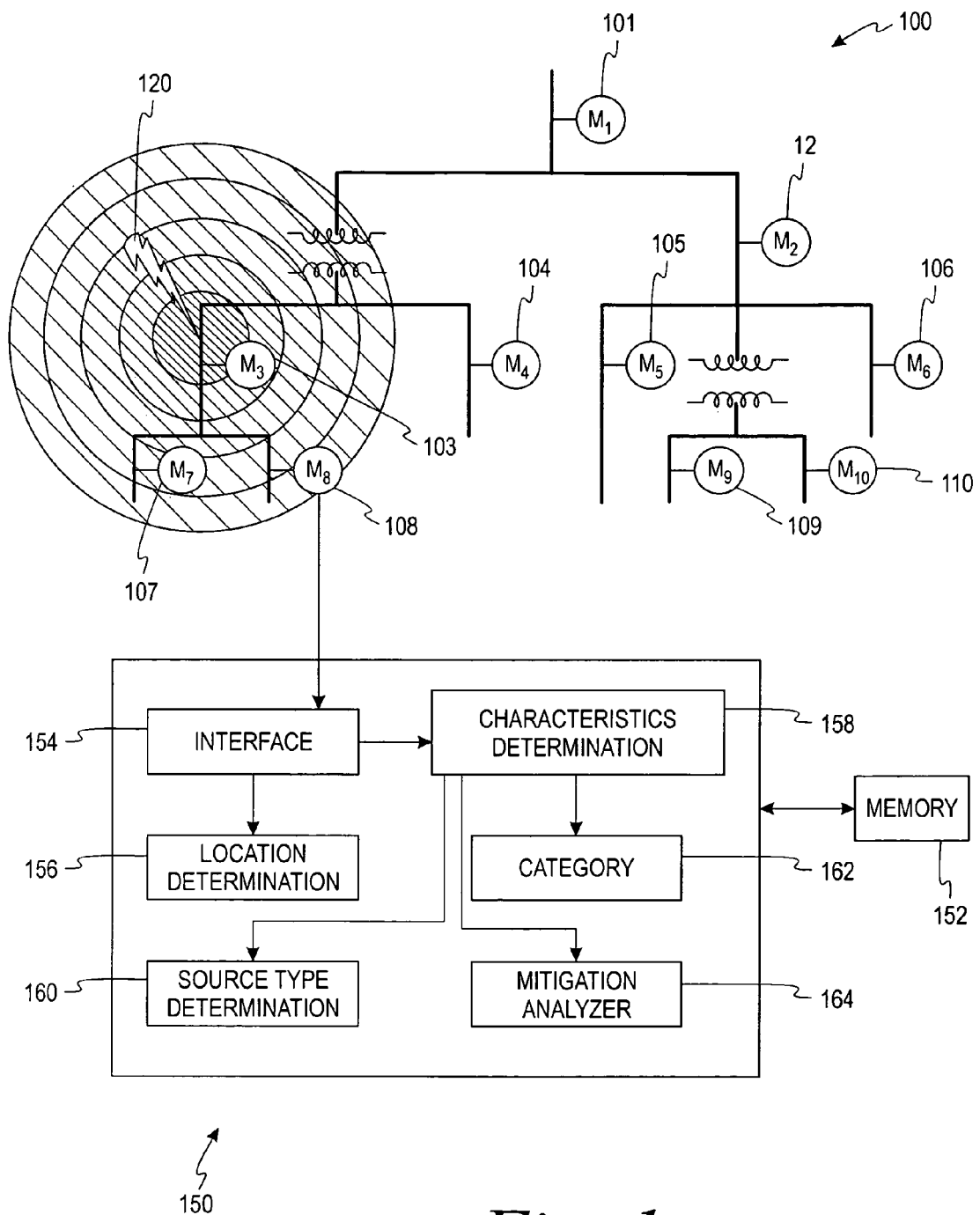
FIG. 1 is a block diagram of an electrical system including the occurrence of a transient event and a transient evaluation system according to an aspect of the present invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENTS

FIG. 1 is a block diagram of a typical electrical power system 100. The electrical power system 100 is a hierarchical structure describing the organization of electrical power system (whether utility-side or demand-side of the point-of-common coupling (PCC)). The electrical power system 100 includes a series of monitoring devices 101-110 which are located throughout the electrical power system 100. Each of the monitoring devices 101-110 represent any electrical system element or apparatus with the ability to sample, collect, or measure the operational characteristics and parameters of the electrical power system 100 to which it is connected. Any or all of the monitoring devices 101-110 may be a PowerLogic® CM4000T Circuit Monitor available from Square D Company or any other suitable monitoring device such as a circuit breaker or a metering device or power meter. When a transient event 120 occurs on the electrical power system 100 as illustrated by the concentric circles in FIG. 1, the magnitude of the transient event 120 attenuates as it propagates through the electrical power system 100 (due to the inductive nature of the conductors and/or other connected apparatuses). The propagation of a transient event on an electrical power system is similar to the effect of tossing a stone into a pond, and aspects of the present invention exploit this phenomenon to determine where a transient event occurs on a known hierarchy. The energy associated with the transient decreases as it spreads through the electrical power system 100 (along the conductors). As used herein, a transient is a type of disturbance and its meaning is intended to be the one afforded by a standards body such as the IEEE or the IEC. A "transient" is presently defined by the IEEE 1159-1995 standard as: pertaining to or designating a phenomenon or a quantity that varies between two consecutive steady states during a time interval that is short compared to the time scale of interest. A transient can be a unidirectional impulse of either polarity or a damped oscillatory wave with the first peak occurring in either polarity. There are at least two types of transients: impulsive and oscillatory. A transient has a typical duration of less than one cycle.

The monitoring devices 101-110 are all coupled via communication links to an example transient evaluation system 150 (though only one communication link is depicted between the monitoring device 108 and the system 150 for clarity purposes). The communication links can be wired or wireless or a combination thereof. The evaluation system 150 may, for example, be implemented by a logic circuit in communication with or integral to the electrical power system 100, or may be implemented by software and/or firmware executed by a CPU or controller (not shown). The example transient evaluation system 150 is coupled to a memory device 152 which is used to store the data collected from the monitoring devices 101-110 or other data used by the evaluation system 150. The evaluation system 150 includes a data interface 154 which is coupled to the monitoring devices 101-110. The data may be collected by the data interface 154 via a wired or a wireless connection. The evaluation system 150 also includes a location determination module 156, a transient characteristics module 158, a source type determination module 160, a categorization module 162 and a mitigation analyzer module 164.

Exploiting the way a transient propagates throughout a power system from its source, the transient evaluation system 150 (whether in a device or a computer) includes the location determination module 156, which determines the general location of a transient's source based on a combination of one or more characteristics of the transient measured at at least some of the monitoring devices 101-110 on the electrical power system 100 and the hierarchy of the electrical power system 100. By general location, it is meant in an aspect that the location determination module 156 identifies which monitoring device in the power-system hierarchy is closest to the transient source. The hierarchy of an electrical system such as the electrical power system 100 in FIG. 1 puts the multiple monitoring devices 101-110 into spatial context with each other. The location information is then provided to the user for any appropriate action to lessen the transient's effects if needed or required. The evaluation system 150 may include a hierarchy classification system that automatically learns the hierarchy of monitoring devices 101-110 present in the electrical power system 100 and their spatial relationships relative to one another. Such a system is described in commonly assigned, U.S. Pat. No. 7,272,518, granted Jul. 18, 2007, entitled "Automated Hierarchy Classification in Utility Monitoring Systems," the entirety of which is incorporated herein by reference in its entirety. Alternatively, the hierarchy of the electrical power system 100 may be entered manually by a user or be already known by the evaluation system 150.

An example of an implementation for automatically determining the hierarchy of the electrical power system, or how N monitoring devices are directly or indirectly linked in a distribution system includes receiving at time intervals device data measured by each of monitoring devices. The implementation calculates from the device data a first correlation coefficient between a reference device and every other device in the distribution system to produce N-1 correlation coefficients. The implementation determines the highest correlation coefficient among the N-1 correlation coefficients. Responsive thereto, the implementation automatically determines whether the device associated with the highest correlation coefficient and the reference device are linked. If that automatic determination determines that the device associated with the highest correlation coefficient is linked to the reference device, then the implementation stores second data representing that the device associated with the highest correlation coefficient and the reference device are linked.

Returning to FIG. 1, determining the location of transient events involves gathering transient event data from the monitoring devices 101-110 and comparing the location of the monitoring devices detecting the occurrence of said data to the hierarchy of the electrical power system 100. For example, in FIG. 1, the exemplary transient event 120 may result in voltage impulses detected on the monitoring devices 103, 107 and 108. Because the monitoring device 103 is in closest proximity to the site of the transient event 120, the spike will have a greater magnitude than the spikes detected by the monitoring devices 107 and 108. The location of the transient event 120 may thus be determined to be near the location of the monitoring device 103 after correlation with the known hierarchy of the electrical power system 100. An implementation for determining the location of the transient source is described in more detail in connection with FIG. 5 below.

As mentioned above, based on the knowledge of the propagation behavior associated with a transient event, the transient evaluation system 150 includes the location determination module 156, which determines the general location of a transient's source based on a combination of one or more characteristics of the transient measured at some or all of the monitoring devices 101-110 on the electrical power system 100 and the hierarchy of the electrical power system 100. One such characteristic that can be used in conjunction with the power-system hierarchy information is magnitude. The respective magnitude characteristics associated with each monitoring device that recorded a transient are compared to determine the monitoring device associated with the highest magnitude. That monitoring device is reported by the location determination module 156 as being the device closest to the actual source of the transient.

Other or additional characteristics can be compared to determine the location of a transient. For example, because the power-system conductors are inductive in nature, the frequency components measured by nearby monitoring devices can be compared. The monitoring device associated with the highest measured frequency components is identified by the location determination module 156 as being closest to the transient source. Due to the inductive nature of the power-system conductors, the higher-frequency components of the power signal will be filtered out, and therefore, monitoring devices further away from the transient source will report a lower frequency components than monitoring devices closer to the transient source.

Another characteristic that can be evaluated in conjunction with known hierarchical information concerning the power-system layout is the energy associated with the transient event. Monitoring devices closer to the transient source will report a higher level of energy characteristic. Still another characteristic is the total duration of the transient event, which appears to be longer for monitoring devices closer to the transient source. In an implementation, a user-defined or automatic threshold value is set, and when the voltage exceeds that threshold, the device counts the time before the voltage falls back within the threshold. That time will be longer for devices closer to the transient source because the peak amplitude or magnitude associated with the transient will be higher closer to the source.

The rise time or the rate of change of the current or voltage is another characteristic that can be evaluated to determine the location of a transient source. The rate of change of the current or voltage will be higher the closer the device is to the transient source. As distance away from the source increases, more of the higher frequency components are filtered out, lessening the rise time of the transient events. By knowing how other monitoring devices recorded the same event, the location determination module 156 can make these comparative evaluations to pinpoint the monitoring device closest to the source of the transient event.

Still another characteristic that can be analyzed by the location determination module 156 is the shape of the transient. As the distance increases from the source of the transient, the shape of the transient will change due to filtering that occurs in the inductive conductors and other connected apparatuses to which the monitoring devices are connected. Thus, for example, if the shape of the transient 120 appears rectangular at the monitoring device 103, but triangular at monitoring device 108, the location determination module 156 concludes that the transient event occurred closest to the monitoring device 103.

As mentioned above, any one or combination of the foregoing characteristics can be evaluated, in conjunction with the known hierarchy of the power-system (how the monitoring devices are connected to one another in the power system), by the location determination module 156 to identify the monitoring device that is closest to the transient event. Additional characteristics can be evaluated to validate the initial determination to confirm that the identification is consistent with the evaluated characteristic(s).

The transient characteristics module 158 collects signal parameter measurements of the transient events detected from the monitoring devices 101-110. Such signal parameter data measured by the monitoring devices is used to determine voltage and/or current characteristics of the transient events. For example, a list of the signal parameter values may include: volts, amps, percentage, time, frequency(s), number of occurrences, rate of change, polarity (additive or subtractive), date (with resolution down to the microsecond range), phase angle, energy, (conventional (Watts or some derivative) or non-conventional (volt-seconds)), effected conductor(s), shape (triangular, rectangular, exponential, damped sinusoidal, rise/decay) and location. The transient characteristics module 158 gathers the signal parameter measurements data and determines different characteristics of the transient events. This module is described in more detail below and particularly in connection with FIG. 6. The source type determination module 160 analyzes selected transient characteristics to assist a user in determining the source of a transient event. This module is described in more detail below and particularly in connection with FIG. 7. The specific transient characteristics from each transient event may be stored in the memory device 152. Transients originating from the same source will exhibit many similar characteristics, and thus, will be easier to identify, locate and mitigate. Simple statistical methods including correlations, histograms, and simple comparisons may be used to assist in identifying transient events with analogous traits. Once identified, the user can draw a parallel between interruptions, degradation, downtime and/or catastrophic failures with respect to a specific transient source. An informed decision may then be made by the user on resolution of the transient occurrence.

There are several characteristics of voltage and current transients that are determined by the transient characteristics module 158. Each voltage or current transient event includes some measurable signal parameters which are used to determine each transient characteristic described below. For example, each voltage or current transient event will have some measurable peak amplitude, measurable level of rise-time, measurable occurrence to a point in time, etc. Examples of transient characteristics include peak magnitude (voltage, current, or energy), voltage or current rise time, duration, frequency, damping factor, phase angle, and whether the transient is additive or subtractive.

Each specific voltage or current transient event determined from the monitoring devices 101-110 in FIG. 1 is sorted into a "bin" based on the quantitative value of each of that voltage or current transient's characteristics. The various "bins" of characteristics data are stored in the memory device 152 by the transient characteristics module 158 for further analysis.

For example, a peak amplitude transient characteristic may be measured in volts, amps, percentage of nominal, or some other parameter describing peak amplitude. The peak amplitude describes the maximum deviation of the current or voltage from its expected or nominal value.

A rise time transient characteristic may be measured in time, rate of rise (dv/dt or di/dt), or some other parameter describing rise time. Rise time is the time between a waveform's initial deviation from its expected value and its peak amplitude. The rise time may be measured by the time between the pick up of a transient event and the peak amplitude of the transient event.

A time of occurrence transient characteristic is measured in terms of years, seasons, months, days, hours, minutes, seconds, milliseconds, microseconds, or some other time scale and is the time when the transient event occurs.

The periodicity of occurrence transient characteristic is the frequency of occurrences over some given period of time.

Frequency components may be measured in Hertz, cycles, or some other parameter describing frequency. Frequency components transient characteristics are any frequency excluding the fundamental or nominal signal superimposed onto the fundamental or nominal signal during the event.

Figure 2A:
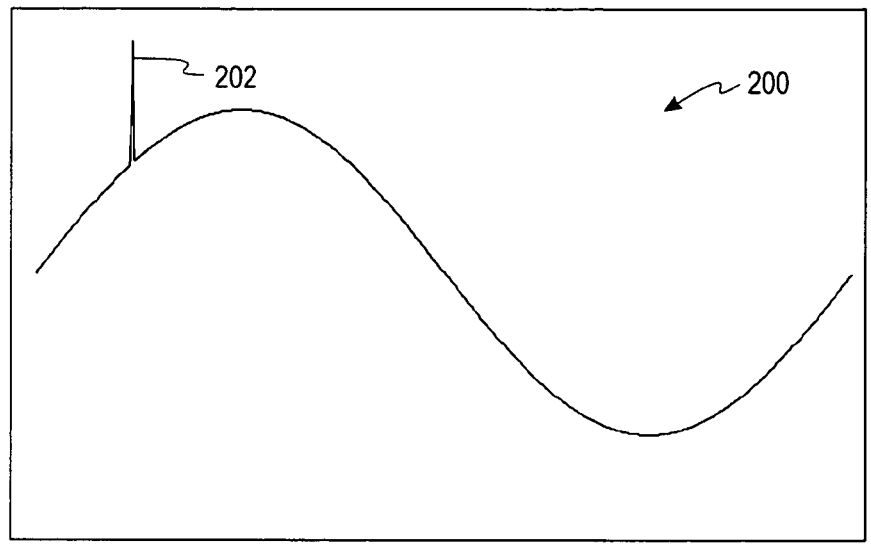
FIGS. 2A and 2B are exemplary prior-art voltage traces showing the initial polarity characteristics of transient events.
Figure 2B:
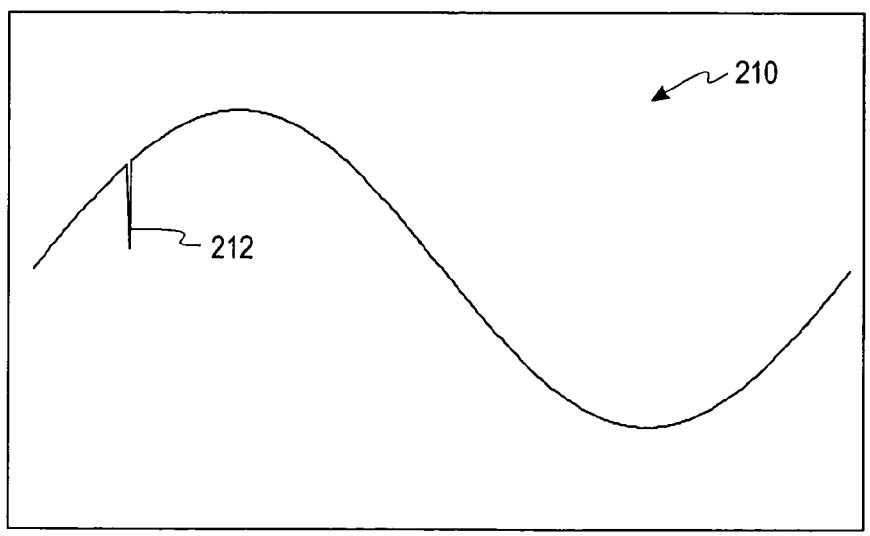

FIGS. 2A and 2B are prior-art voltage traces of an initial polarity transient characteristic of an exemplary transient event. FIG. 2A includes a voltage trace 200 which shows a positive transient impulse 202. The initial polarity is the initial direction of the transient event with respect to the fundamental or nominal signal. In other words, the polarity describes whether energy is being taken out of the nominal signal or energy is added into the nominal signal. FIG. 2B includes a voltage trace 210 which shows a negative transient impulse 212. The initial polarity may be characterized as additive or subtractive, out of or into the waveform, or positive or negative.

Another transient characteristic is decay time which may be measured in terms of time, rate of decay (dv/dt or di/dt), or some other parameter describing decay time. The decay time is the time between a waveform's peak amplitude and its return to the normal signal. One measure of delay time may be the time between the peak amplitude of the transient event and dropping below some threshold on the monitoring device.

A total duration transient characteristic may be measured in terms of time, cycles, rise time plus decay time, or some other parameter describing the total duration of a transient event. The total duration is the total length in time of a transient event. The total duration may be expressed as either the time between a monitoring device picking up a transient event and dropping out of the same event or the rise time plus the decay time as measured by a monitoring device.

The phase angle transient characteristic is measured in terms of degrees, radians, or some other parameter describing where on a sine wave a transient event occurred. The phase angle is the point within the sine wave when a transient event occurs, typically measured in degrees (0° to 360°) or radians (0 to 2π). One measure may be the point within a sine wave when the monitoring device picks up the transient event. Another measure may be the point within a sine wave when the peak voltage of the transient event occurs. Another measure may be when the monitoring device drops out the transient event.

Energy and cumulative energy transient characteristics may be measured by both conventional (e.g., watts, milliwatts, microwatts, etc.) and non-conventional (e.g., volt-seconds, millivolt-seconds, etc.) measures or any other suitable measures. The energy is the total energy associated with a transient event, either on an individual phase or all phases. The energy may be determined by the duration (seconds) and peak magnitude (volts) of the transient event (duration X peak magnitude). Another method of determining energy is by the shape, duration (seconds) and peak magnitude (volts) of the transient event (½ X duration X peak magnitude for a triangular shape). Cumulative energy refers to the sum of the energy on each specific conductor (or any combination of conductors) over some time period.

The shape transient characteristic may be defined as triangular, rectangular, exponential, damped sinusoid, rise/decay, or any other geometric description of the shape of a transient event. The shape is the geometric shape of the transient event such as triangular, rectangular, exponential, damped sinusoid and a rise/decay profile, which has ramp-like shape.

The affected conductor(s) refers to the specific conductor or conductors (either typically current carrying or not) that experience a transient event. The affected conductor(s) may be any combination of an A-phase conductor, B-phase conductor, C-phase conductor, a neutral conductor, and a ground conductor.

The location characteristic is whether the transient event occurs on the source side or load side on the power system 100 from any device that has the capability to measure any subset of the transient characteristics. The location refers to the general location of the transient event based on the known hierarchical information referred to above.

A "bin" refers to a range of quantitative values that is either defined by the user, automatically predefined, or provided by default within the monitoring devices 101-110. The "bins" are compiled and may be stored in the memory device 152 for detected transient events. There can be one or more bins for each transient characteristic. The number of bins is independent for each transient characteristic and the greater the number of bins, the greater the resolution on the characteristic. For example, one embodiment may have three bins for peak amplitude (between 100-150%, between 150%-250% and over 250%) and four bins for phase angle (0-90 degrees, 90-180 degrees, 180-270 degrees and 270-360 degrees). Using one bin for a specific transient characteristic essentially eliminates that specific transient characteristic from some analyses because each transient will be lumped into that bin.

Each voltage or current transient event is evaluated against a transient evaluation user configuration matrix (one example is shown in Table 1 below) by the categorization module 162 in FIG. 1. The settings (including the number of bins per transient characteristic, the quantitative values used for each transient characteristic, the range of each bin, and the specific transient characteristics to be evaluated) in this matrix may be either user configured, determined based on given default values, or auto configured. Because the transient characteristic information is kept in the memory device 152 for each transient event, the user can reconfigure the bins as required to optimize the settings. The software or the monitoring firmware in the monitoring devices 101-110 may also determine optimal settings based on statistical analysis of the transient data.

TABLE 1

Transient Evaluation Configuration Matrix

| TRANSIENT CHARACTERISTICS | BIN 1 | BIN 2 | BIN 3 | BIN 4 | BIN 5 |
|---|---|---|---|---|---|
| Peak Amplitude | 100% < x ≦ 150% | 150% < x ≦ 250% | 250% < x | | |
| Rise Time | 0 < x ≦ 500 nsec | 0.5 < x ≦ 200 μsec | 200 μsec < x | | |
| Time of Occurrence | Date/Time | | | | |
| Periodicity of Occurrence | 0 < x ≦ 3 | 3 < x ≦ 7 | 7 < x ≦ 12 | 12 < x | |
| Frequency Components | 1000 Hz < x ≦ 5000 Hz | 5000 Hz < x ≦ 15000 Hz | 15000 Hz < x | | |
| Initial Polarity | Additive | Subtractive | | | |
| Decay Time | 0 < x ≦ 500 nsec | 0.5 < x ≦ 200 μsec | 200 μsec < x | | |
| Total Duration | 0 < x ≦ 1 μsec | 1 < x ≦ 400 μsec | 400 μsec < x | | |
| Phase Angle | 0° < x ≦ 90° | 90° < x ≦ 180° | 180° < x ≦ 270° | 270° < x ≦ 360° | |
| Energy | 0 < x ≦ 0.1 V-Sec | 0.1 < x ≦ 0.5 V-Sec | 0.5 V-Sec < x | | |
| Shape | Triangular | Rectangular | Exponential | Damped Sinusoid | Rise/Decay |
| Affected Conductors | A-Phase | B-Phase | C-Phase | Neutral Conductor | Ground Conductor |
| Cumulative Energy | A-Phase | B-Phase | C-Phase | Neutral Conductor | Ground Conductor |
| Location | Between Utility Meter and Main | Between Main and Feeder 1 | Between Main and Feeder 2 | Downstream from Feeder 1 | Downstream from Feeder 2 |

In Table 1, a maximum of five bins are provided for any given characteristic. It is to be understood that more or less bins may be provided depending on the desired degree of resolution. Once a transient characteristic is determined based on the signal parameters measured by the monitoring devices 101-110 in FIG. 1, the data is placed in an appropriate "bin" according to the ranges of the "bins" in the transient evaluation configuration matrix. For example, if a phase angle characteristic was determined to be 300 degrees, bin number four in Table 1 would be incremented for the respective transient characteristic.

By determining and classifying transient events via the transient evaluation configuration matrix, many characteristics of the transient event may be evaluated. It is to be understood that such evaluation may use some or all of the transient characteristics in the transient evaluation configuration matrix. The evaluation allows a user to identify whether the electrical power system 100 is experiencing transient events from a single source or multiple sources. By evaluating the characteristics of a transient event, a list of potential transient sources may be provided to the user by the source type determination module 160. Knowledge of the transient's source allows more effective mitigation or elimination of the transient's effects. By tracking the source or sources, a user may determine the most effectual placement(s) of transient mitigation devices. This feature will also allow the user to ascertain the effectiveness of any installed transient mitigation devices via the mitigation analyzer module 164.

Evaluating a high-speed voltage transient source type assists in locating the transient's cause. Each transient source type exhibits its own characteristic signature. Analysis of these characteristics gives important clues as to the cause of the transients, and the evaluation system 150 uses each transient event's characteristics to provide a general determination of the transient cause based on the information available.

Transient source types may occur outside a facility (e.g., on the utility's electrical system) or inside a facility (e.g., on the user's electrical system). Therefore, location is paramount in determining a transient source type. Some examples of transient source types that may occur on the utility's electrical system include capacitor switching, line switching, transformer switching, the operation of current limiting fuses, and lightning. Some examples of transient source types that may occur on electrical systems include current interruption, electrostatic discharge, operation of power electronics, welding, copy machines, bouncing contacts, faulty wiring, circuit breaker operation, contact and relay closure, and the startup and disconnect of loads.

Figure 3A:
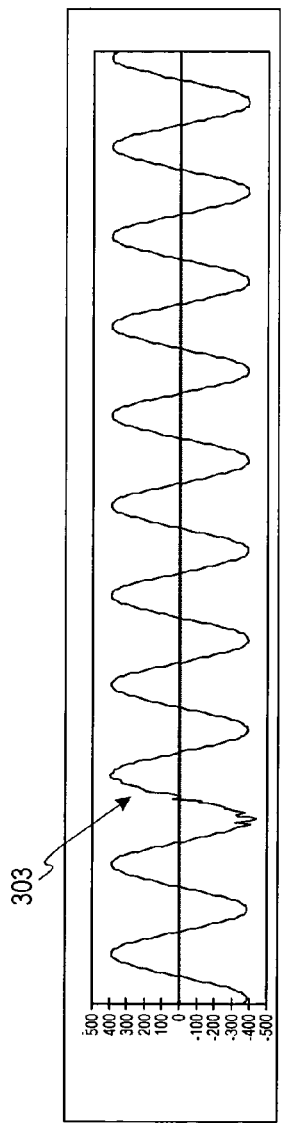
FIGS. 3A-3C are exemplary prior-art waveform captures showing transient events on all three phases resulting from energizing a three-phase capacitor bank.
Figure 3B:
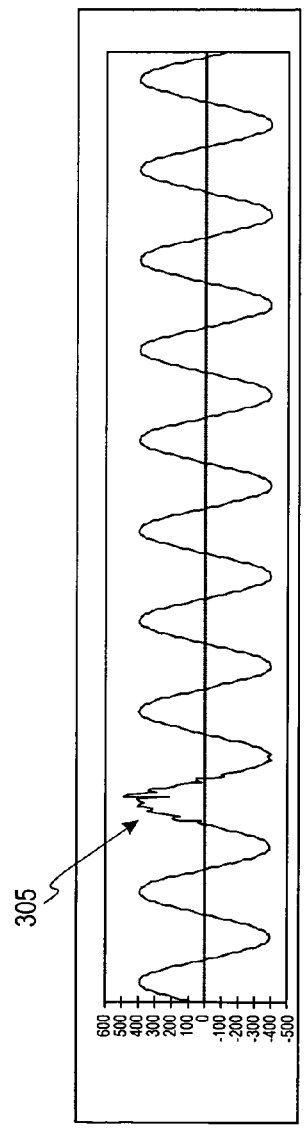
Figure 3C:
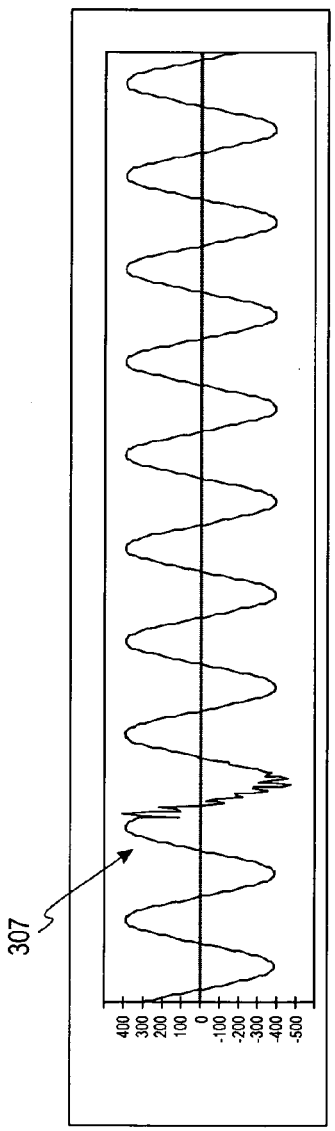

By way of example, a source of a transient may occur as a result of switching on a large capacitor or capacitor bank in the electrical power system 100. Switching on a large capacitor bank will result in certain transient characteristics that may be analyzed by the evaluation system 100 based on signal parameters measured by the monitoring devices 101-110 in FIG. 1. FIGS. 3A-3C are waveform captures of an exemplary prior-art voltage transient on the three phases of voltage signals caused by a three phase capacitor bank switching on. FIG. 3A shows a waveform 302 having a sinusoidal shape which includes the transient occurrence 303 caused by switching on the capacitor. FIG. 3A represents the effect on a signal in a first phase from charging the capacitor which causes the transient occurrence 303. FIG. 3B shows a waveform 304 which includes a transient 305 showing the effect of capacitor charging on the waveform 304 in a second phase (shifted 120 degrees from the waveform 302 in FIG. 3A). FIG. 3C shows a waveform 306 which includes a transient 307 showing the effect of capacitor charging on the waveform 306 in a third phase (shifted 120 degrees from the waveform 304 in FIG. 3B). The transient affects all three phase conductors simultaneously but because each phase is 120 degrees shifted relative to each other, the transient affects different parts of the respective waveforms.

Some of the transient characteristics due to the switching on of a capacitor include initial polarity, shape, decay time, affected conductors, energy, periodicity and time of occurrence, phase angle, frequency components and location. The presence and level of these transient characteristics will lead to an accurate determination of the source of the transient event as the switching on of a capacitor. For example, the initial polarity of the transient event is subtractive (opposite the polarity of the sine wave) because energy is removed from the system to charge the capacitor. With regard to shape, the waveform exhibits a damped sinusoidal shape. With regard to decay time, capacitor switching typically decays within ½ to 2 cycles. With regard to affected conductors, all three conductor phases are affected simultaneously to some degree. With regard to energy, generally, two of the three phases are more affected than the third phase and will have a higher energy value as compared to the third phase as well as shown in FIGS. 3B and 3C. This is because of the phase relationship between the three phases (120° apart from each other), and the inherent proximity that one of the three phases such as in FIG. 3A will be to the zero-crossing. The phase closest to the zero-crossing of the voltage will be less affected by the transient event because the voltage of the sine wave is smaller as it approaches the zero-crossing (resulting in a lower charging current for the capacitor—and thus a smaller transient).

With regard to periodicity of occurrence, capacitor switching typically occurs once or twice a day depending on the number of capacitor banks located on the electrical system. With regard to time of occurrence, in most cases, capacitor switching events will occur during seasons that are load peaking for the utility. Therefore, some capacitor switching events will occur more frequently during summer or winter seasons (when utility loads are near their maximum) and less frequently during spring or fall seasons (when utility loads are more moderated). With regard to phase angle, the phase separation between the transients on each phase is 120° apart from the other phases because the capacitor banks generally close into all three phases simultaneously. With regard to frequency components, during a capacitor switching event, higher frequency components are superimposed on the sine wave—initially some of these frequency components may be greater than 50 kHz while the successive decaying components may range from 400 Hertz to 4 kHz. With regard to location, most capacitor switching events are located on the utility's electrical system, and thus, will be upstream from the highest monitoring device in the power system hierarchy.

The determination of these and other characteristics allows the source type determination module 160 to determine a capacitor as the source of the transient events. Other indoor sources which may be determined by transient characteristics may include current interruption caused by motors and the like, power electronics operation of SCR devices and the like, electro-static discharge (ESD), welding devices, copier machines, faulty wiring, circuit breakers, contact or relay closure, and load startup or disconnect. Outdoor sources which may be determined by transient characteristics may include lightning, capacitor switching, line or cable switching, transformer switching, or operation of a current-limiting fuse. Some of these sources of transients are subtractive, such as capacitor switching, power electronics, welding devices, copier machines, faulty wiring, circuit breakers, and load startup. This data and similar data can be stored in a library of known or expected characteristics for various transient source types, such as the library 712 shown in FIG. 7.

Thus, each of the transient source types (both on the utility electrical system and the end-user's electrical system) has its own unique transient characteristics that describe it. Evaluating only one transient characteristic would make it difficult to determine the cause of the transient event such as that shown in FIGS. 3A-3C. However, evaluating supplemental transient characteristics from repeated events provides a higher level of confidence as to the cause of the transient event as shown in this example to match a capacitor bank switching on.

The mitigation analyzer module 164 provides solutions to mitigate the transient events. There are many solutions available to mitigate high-speed voltage transients and the proper characterization of voltage transient events allows optimized solutions to be realized. The determination of the location of the transient is used to locate the best placement for a transient mitigating device by the mitigation analyzer module 164. The characteristics data derived by the evaluation system 150 provides characteristic information that may be used to determine the sizing of the mitigation equipment by the mitigation analyzer module 164. The analysis of the type of the transient source involved allows a determination of the type of mitigation equipment that is required to eliminate or reduce the effects of the voltage transients by the mitigation analyzer module 164. For example, a cost-effective technique to reduce or eliminate an additive voltage transient is the use of a surge protective device (SPD). On the other hand, the effects of a subtractive voltage transient may be reduced or eliminated using a line reactor (or choke). The sizing of the SPD or line reactor will depend on the specific characteristics of the voltage transients being experienced on the electrical power system.

For example, as defined by the IEEE standard 1159-1995, there are two types of transients: impulsive and oscillatory. Impulsive transients consist of two subtypes: additive and subtractive. Additive impulsive transients, subtractive impulsive transients, and oscillatory transients are characteristically different and may require different approaches to mitigate their effects on equipment.

There are many different techniques and devices available to mitigate the effects of transient events. Many aspects of the transients must be considered to determine which approach is the most cost effective. For example, surge protective devices (SPDs) are a relatively inexpensive method to mitigate additive impulsive transients, but will do nothing to mitigate subtractive impulsive transients. SPDs can mitigate the overvoltage swings of oscillatory transients, but are not typically the best approach due to other inherent characteristics of oscillatory transients. Line reactors (or chokes) are effective for reducing the high frequency components of all varieties of transients, but are more expensive and may still allow some unwanted lower frequencies to pass. These are typically used to reduce the effects of subtractive transients due to power electronic equipment, or the higher frequencies associated with capacitor switching. Isolation transformers are another method to eliminate transients of all varieties, but are even more expensive. They, too, are used to eliminate higher frequency components from the operation of power electronic equipment. Finally, a variety of low pass filtering apparatuses may be used to eliminate higher frequency components, but they can be a very expensive approach to mitigate transient events.

The mitigation analyzer module 164 evaluates transient event characteristics to determine which mitigation approach would be suited to a transient event or events that were experienced. The user can choose to have the mitigation analyzer module 164 determine the best mitigation technique for each individual transient event. Another approach is to accumulate historical transient data to ensure that the most cost effective approach is indeed chosen. For example, the mitigation analyzer module 164 may determine (using the techniques described above) that a utility capacitor bank is switching on every day and causing an adjustable speed drive to trip off line, resulting in the loss of product. No other loads are being affected by the capacitor switching. Moving the capacitor bank may not be an option, while using an SPD will generally have little to no effect on mitigating capacitor bank switching. Several approaches would be recommended in order of their cost by the mitigation analyzer module 164 including: 1) approaching the utility about eliminating the problem, 2) using a line reactor (choke); 3) using an isolation transformer; 4) filtering; 5) isolating the source; and so forth.

This mitigation analyzer module 164 allows the user to enter data relating to whether any mitigation technique is acted upon including what mitigation technique is chosen, the date it is installed, and other pertinent information associated with the specific mitigation technique (e.g., cost, voltage rating of SPD, impedance of line reactor, etc.). The mitigation analyzer module 164 may determine (using statistical and/or simple analysis of the historical data) the effectiveness of the applied mitigation technique based on an evaluation of changes in the transient characteristics gathered subsequent to the mitigation by the evaluation system 150. A report of the statistical findings in both graphical and textual formats that discusses any improvements since installing the mitigation device may be generated and associated data can be stored in the memory 152. The mitigation analyzer module 164 can also predict the beneficial effects of adding certain mitigation devices to the system 100.

The confidence of any conclusions made by the mitigation analyzer module 164 may be evaluated against an array of data captured by the monitoring devices 101-110 in FIG. 1. Because the electrical power system hierarchy is known and historical transient data is available, the data can be put in context between multiple devices to improve the certainty of any conclusions offered by the evaluation system 150.

Figure 4A:
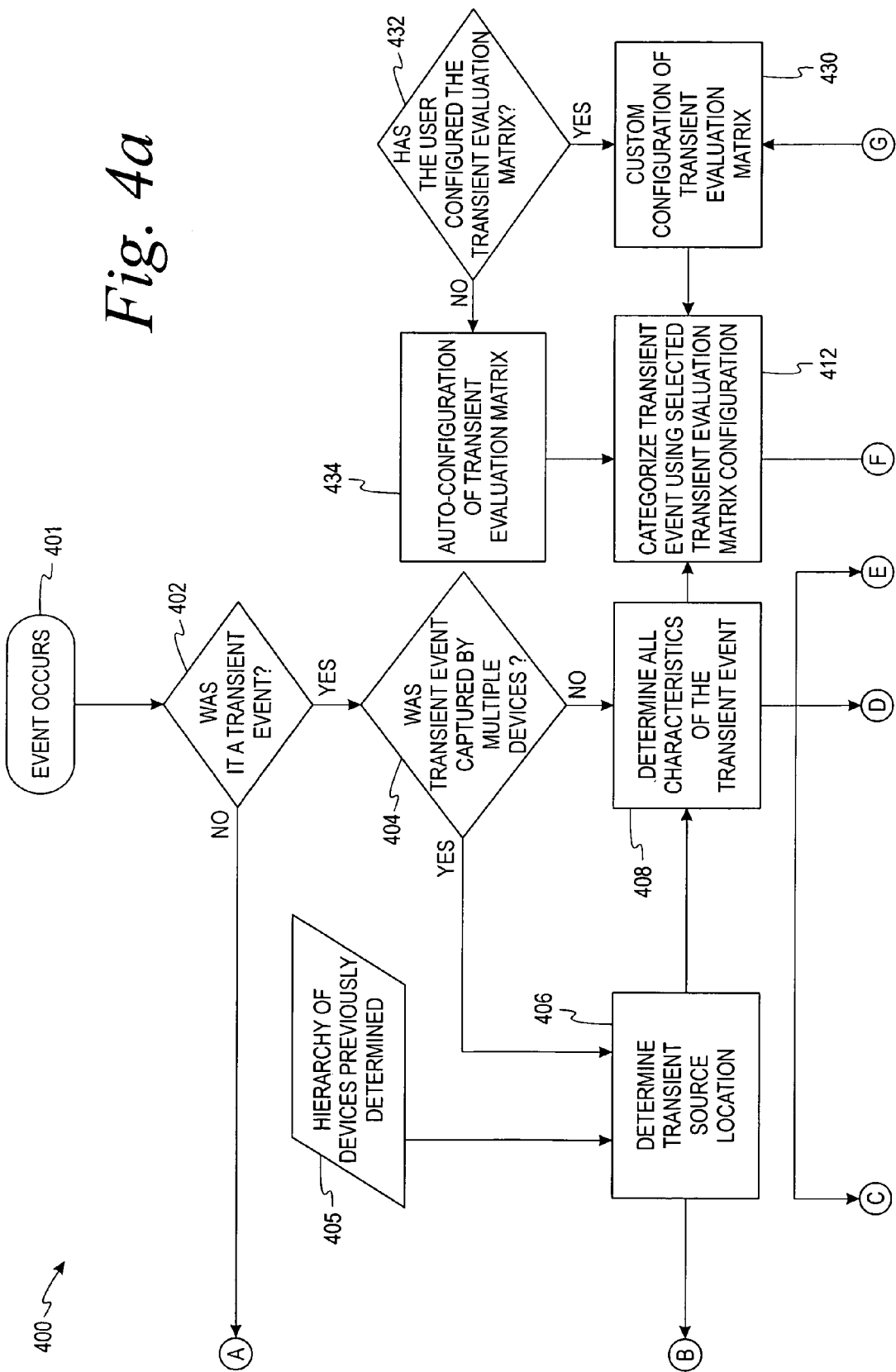
Figure 4B:
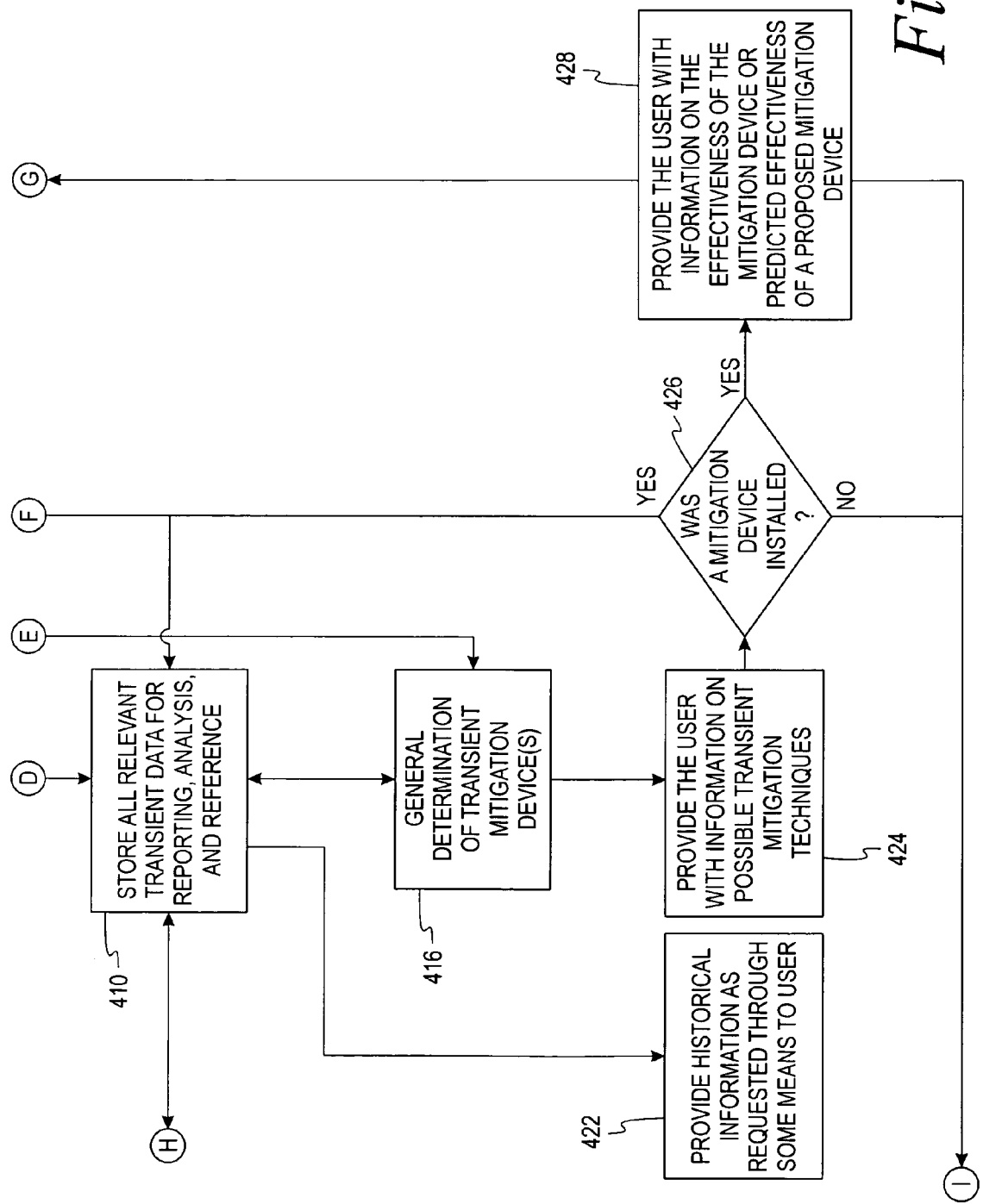

FIGS. 4A-C represent a flow chart 400 representative of example machine readable instructions for implementing the evaluation system 150 of FIG. 1. In this example, the machine readable instructions comprise an algorithm for execution by: (a) a processor, (b) a controller, and/or (c) any other suitable processing device. The algorithm may be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a processor and/or embodied in firmware or dedicated hardware in a well known manner (e.g., it maybe implemented by an application specific integrated circuit (ASIC), a programmable logic device (PLD), a field programmable logic device (FPLD), discrete logic, etc.). For example, any or all of the location determination module 156, transient characteristics module 158, source type determination module 160, categorization module 162 and mitigation analyzer module 164 could be implemented by software, hardware, and/or firmware. Also, some or all of the machine readable instructions represented by the flowchart of FIG. 4 may be implemented manually. Further, although the example algorithm is described with reference to the flowchart illustrated in FIG. 4, persons of ordinary skill in the art will readily appreciate that many other methods of implementing the example machine readable instructions may alternatively be used. For example, the order of execution of the blocks may be changed, and/or some of the blocks described may be changed, eliminated, or combined.

When any electrical event occurs, the evaluation system 150 determines whether the event was a transient (based on the standard industry-accepted IEEE or IEC definition of a transient) (402). If the electrical event was not classified as a transient, the evaluation system 150 ends the algorithm and nothing happens. However, if the electrical event was classified as a transient event, the evaluation system 150 determines whether multiple monitoring devices such as the monitoring devices 101-110 in FIG. 1 recorded the transient (404). If multiple monitoring devices record the transient, then the location determination module 156 determines the location of the transient event within the electrical power system 100 by comparing the magnitude of the transients measured by multiple monitoring devices and determining the monitoring device measuring the highest magnitude. The location is then determined by the place of the monitoring device within the hierarchy of the electrical power system 100 (406) based on the previously determined (manually or automatically) hierarchy of devices 405, which describes how the monitoring devices 101-110 are connected to one another in the electrical power system 100. The location determination (406) is carried out by the location determination module 156, and is described in more detail in FIG. 5. If only a single monitoring device records the transient event, the source location of the transient is determined to be near the location of the monitoring device that recorded it. Information regarding the transient event's source location is provided to the user and also passed on as a transient characteristic to be used in other evaluations.

The transient event is then evaluated by the transient characteristics module 158 to determine all the characteristics of the transient event (408). It is also possible to evaluate the transient's characteristics either in parallel or before the transient's location is determined. Once the transient's characteristics are evaluated, the evaluation system 150 performs several operations concurrently (in this embodiment). First, information for that individual transient's characteristics is stored in the memory device 152 for future use in reporting, analysis, and/or as a reference as needed (410). Second, information for that individual transient's characteristics is passed to the categorization module 162 that uses the transient evaluation matrix (either the user's custom configuration, some default configuration, or an auto configuration) to categorize the transient event based on a comparison with prior detected transient characteristics (412). Details of an algorithm for categorizing transient events are discussed in more detail in connection with FIG. 6 below. Third, information for that individual transient's characteristics is passed to the source type determination module 160 that provides a general determination of the transient's source type as discussed (414). An algorithm for determining the type of transient is discussed in more detail in connection with FIG. 7 below. Fourth, information for that individual transient's characteristics is passed to mitigation analyzer module 164 that provides a general determination of effectual transient mitigation techniques for the transient in question (416).

Data and information stored in the memory device 152 may include both raw transient characteristics associated with specific transient events and/or aggregated data via the "bins" (processed against the transient evaluation matrix) in step 412. Data stored in the memory device 152 may also include other information including any general determinations of transient source types, suggested transient mitigation devices, and whether transient mitigation devices were added (along with specifics regarding said devices). The user may assess the stored data and information at their discretion for reporting, viewing, additional analysis, configuration, and other purposes.

For example, the user may be provided with information on the transient source location (418) as an output of the determination of the source location (406). A user may be provided with information on possible transient source types (420) as an output from the determination of the transient source type (414). The user may also be provided as requested through some means historical information (422) based on the storage of the relevant transient data (410). Mitigation of the transient may be performed by requesting possible mitigation techniques (424) based on the determination of the mitigation devices (416). The mitigation analyzer module 164 may then determine whether a mitigation device was installed (426) (knowledge of a mitigation device's installation has to come from user input). If the mitigation device was installed, the mitigation analyzer module 164 may provide the user with information on the effectiveness of the mitigation device (428). The data collected and analyzed are stored and used for future assessments. The user is allowed to enable or disable all or any subset of data gathered and analyzed by the evaluation system 152. The user is allowed to view all or any subset of information produced by these modules.

Thus by incorporating the above mentioned devices a user is able to determine to what extent a transient event affected an electrical power system. This also allows a user to determine useful information such as the location of the source of a transient on the electrical system, what electrical apparatus had the most exposure to the transient event, and how to most effectively mitigate or even eliminate the transient source from the electrical power system. When the multiple detectors are incorporated across a power system, the user may effectively determine the location of a transient source within their facility or determine if the transient source is on the source-side of the point-of-common coupling (PCC). This will allow the user to more quickly ascertain and mitigate transient events in their facility.

By determining and classifying transient events, many characteristics of the transient event may be evaluated. This will allows a user to identify whether their electrical power system is experiencing transient events from a single source or multiple sources. By evaluating a transient's characteristics, a list of potential transient source types may be provided to the user. Knowledge of the transient's source allows more effective mitigation or elimination of the transient's effects. By tracking the source, a user may determine the most effectual placement(s) of transient mitigation devices. This feature will also allow the user to ascertain the effectiveness of any installed transient mitigation devices as well as to predict the effectiveness of any considered transient mitigation device(s).

Figure 5:
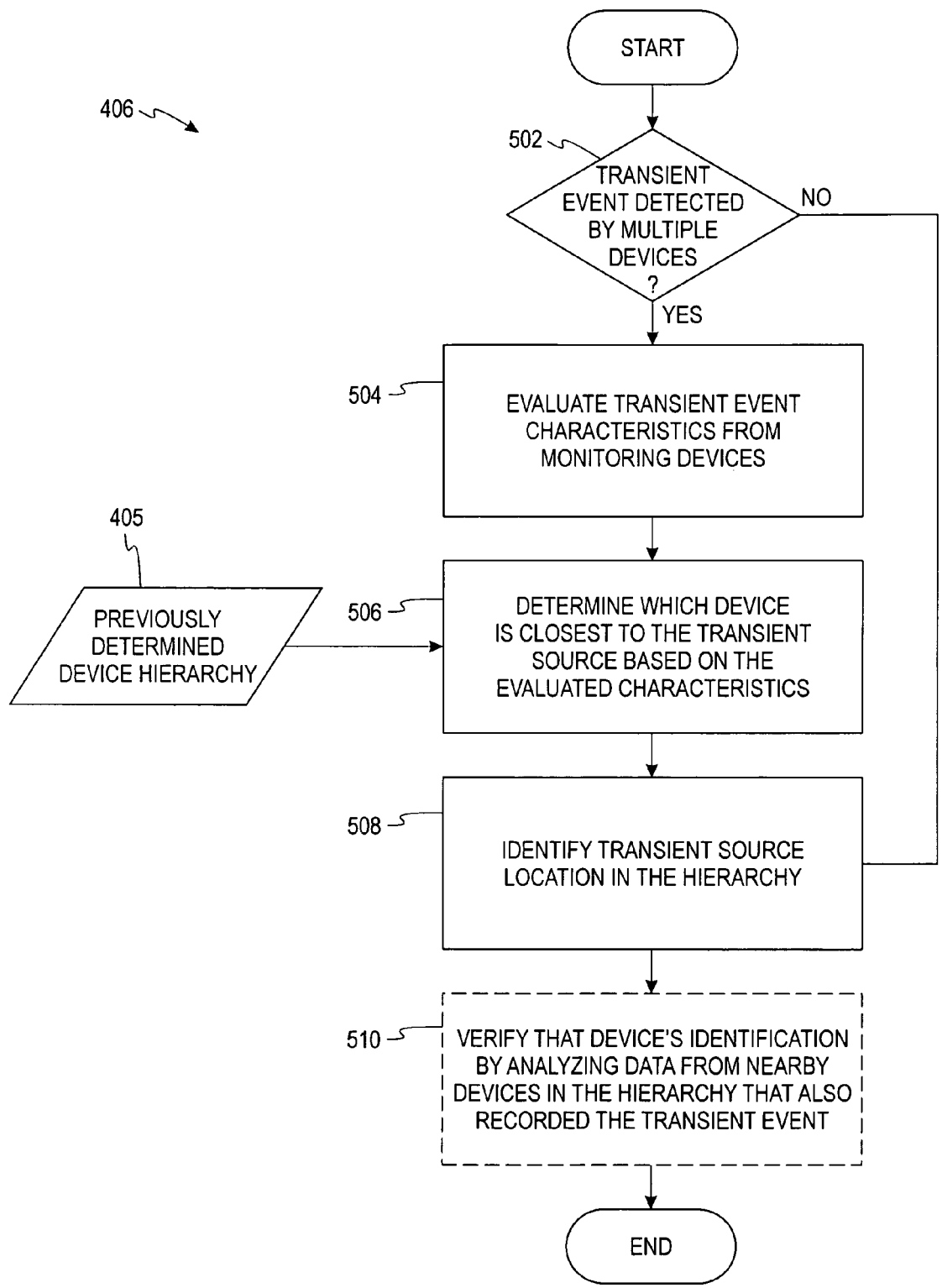
FIG. 5 is a flow diagram of a process for determining a location of a transient source type.

FIG. 5 illustrates an exemplary method for determining the transient source location (406), which is carried out by and stored in the location determination module 156 of the evaluation system 150. The algorithm 406 determines whether the transient event (such as the transient event 120) was detected by multiple monitoring devices, such as the monitoring devices 101-110 (502). If so, data corresponding to the characteristics of the transient event from each monitoring device that detected the transient event is evaluated (504). Examples of these characteristics were described above and include magnitude, frequency components, energy, transient-event duration, transient-event decay time, peak amplitude, rise time, and shape of the transient. Each monitoring device that detected the transient event transmits its signal parameter values to the evaluation system 150, which characterizes the signal parameter values for evaluation.

The algorithm 406 receives hierarchical information 405 relating to how the monitoring devices are connected together in the power system 100, and uses that hierarchical information together with the evaluated transient-event characteristic(s) to determine which monitoring device is closest to the transient source (506). In an alternate implementation, the algorithm 406 uses only the evaluated transient-event characteristic(s) to determine which monitoring device is closest to the transient source (506). Based on the determination (506), the algorithm 406 identifies the transient source location in the hierarchy (508) as corresponding to the monitoring device determined to be closest to the transient source. This identification is also made if the algorithm determines that the transient event was detected by a single device (502).

Optionally, the algorithm 406 verifies or validates the identification of the monitoring device closest to the transient source by evaluating signal parameter data from nearby monitoring devices in the hierarchy that also detected the transient event. Here, the knowledge of the hierarchical layout of the monitoring devices in the power system 100 can be exploited to verify the device identified to be closest to the transient source. For example, referring to FIG. 1, the evaluation system 150 knows from the hierarchical information that monitoring device 107 is downstream of and directly connected to the monitoring device 103 interposed by a feeder or conductor. If the monitoring device 103 is recording the highest voltage magnitude, for example, the system 150 expects that the monitoring device 107 should record a lower voltage magnitude because of its location relative to the monitoring device 103. If the magnitude recorded by the monitoring device 107 is less than the magnitude recorded by the monitoring device 103, the algorithm 406 concludes that its initial identification is accurate. Additional or other similar "checks" could be performed on the initial identification based on the hierarchical information 405, the expected propagation behavior of the transient event, and other transient-event characteristics. While a relatively simple power system 100 is described herein, the implementations of the present invention described herein are increasingly beneficial as the complexity and size of the power system 100 increases. In fact, operators can expand the power system 100 easily without worrying that adding additional devices to the power system 100 will require substantial additional operator time for learning or reconfiguring system parameters. The automated-learning aspects of the hierarchy contemplated herein would require no reconfiguration of the system parameters when the hierarchy is expanded, and transient events could be detected and evaluated immediately because the evaluation system 150 auto-configures itself to recognize new devices and receives the updated hierarchical information 405.

Figure 6:
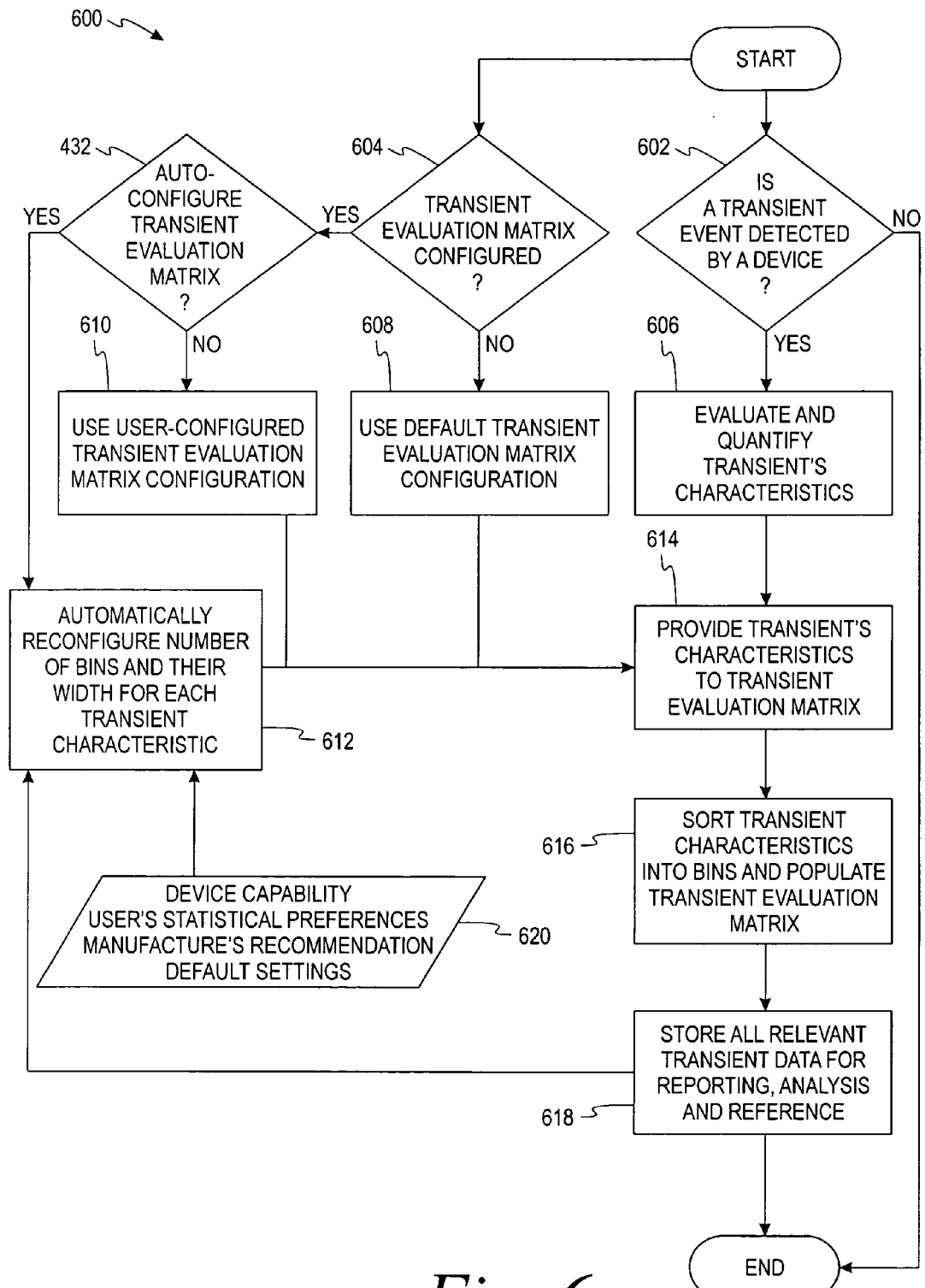
FIG. 6 is a flow chart diagram of a process for categorizing a transient event.

FIG. 6 illustrates a flow chart of a transient-event categorization algorithm 600, which is stored in the categorization module 162 of the evaluation system 150. If a transient event is detected by a monitoring device (602), the algorithm 600 evaluates and quantifies the characteristics of the transient (606). The signal parameter values computed by the monitoring device are used to determine the characteristics of the transient, and data representing those transient characteristics is stored either in the monitoring device or in the evaluation system 150. The algorithm 600 checks whether the Transient Evaluation Matrix is configured (604), and if not, uses a default Transient Evaluation Matrix configuration (434), which includes predetermined bins for a predetermined set of transient characteristics, such as the exemplary Transient Evaluation Matrix shown in Table 1 above. If the matrix is configured, the algorithm 600 determines whether the Transient Evaluation Matrix is configured for auto-configuration (432). If not, the algorithm 600 uses the user-configured Transient Evaluation Matrix configuration (610), which includes a set of transient characteristics and a set of bins configured by the user. If the matrix is configured for auto-configuration, the algorithm 600 automatically reconfigures the number of bins and their width or resolution based on the capabilities of each connected device and statistical analysis of the data, if applicable, for each transient characteristic in the matrix (612). The initial configuration of the Transient Evaluation Matrix is made in accordance with stored information 620 relating to the monitoring device's capabilities, the user's statistical preferences, the device manufacturer's recommendations, and default settings, which are received as an input to populate the matrix.

Once the matrix has been appropriately configured either by the user or automatically and the transient characteristics have been evaluated, the transient characteristics associated with the monitoring device that detected the transient event are provided to the Transient Evaluation Matrix (614). The appropriate bins (see the exemplary Table 1 above) are incremented based on the transient characteristics in the Transient Evaluation Matrix (616). By way of example only, if the frequency component transient characteristic associated with the transient event exceeds 15 kHz, then it would be sorted into bin number three in Table 1. If its peak amplitude was less than 150% of the expected peak, then the peak amplitude transient characteristic would be sorted into bin number one in Table 1. This data is stored (618) in the evaluation system 150 for reporting, analysis, and reference purposes. As transient events occur, the Transient Evaluation Matrix database builds and accumulates data over time, which enhances its ability to identify future transients that resemble or are identical to historical transients observed by the system 150. As similar periodic transients occur, the same combination of "bins" continue to "fill up," allowing the system 150 to determine that a certain transient is occurring with regularity. One of the transient characteristics shown in Table 1 is the time and date of occurrence of the transient, and this data can be analyzed to determine the periodicity of a transient. The stored data (618) can be used to identify the type of transient or to suggest mitigation measures, including identifying troublesome equipment that might be causing a transient. These aspects are discussed in more detail in FIGS. 7-8 below.

Figure 7:
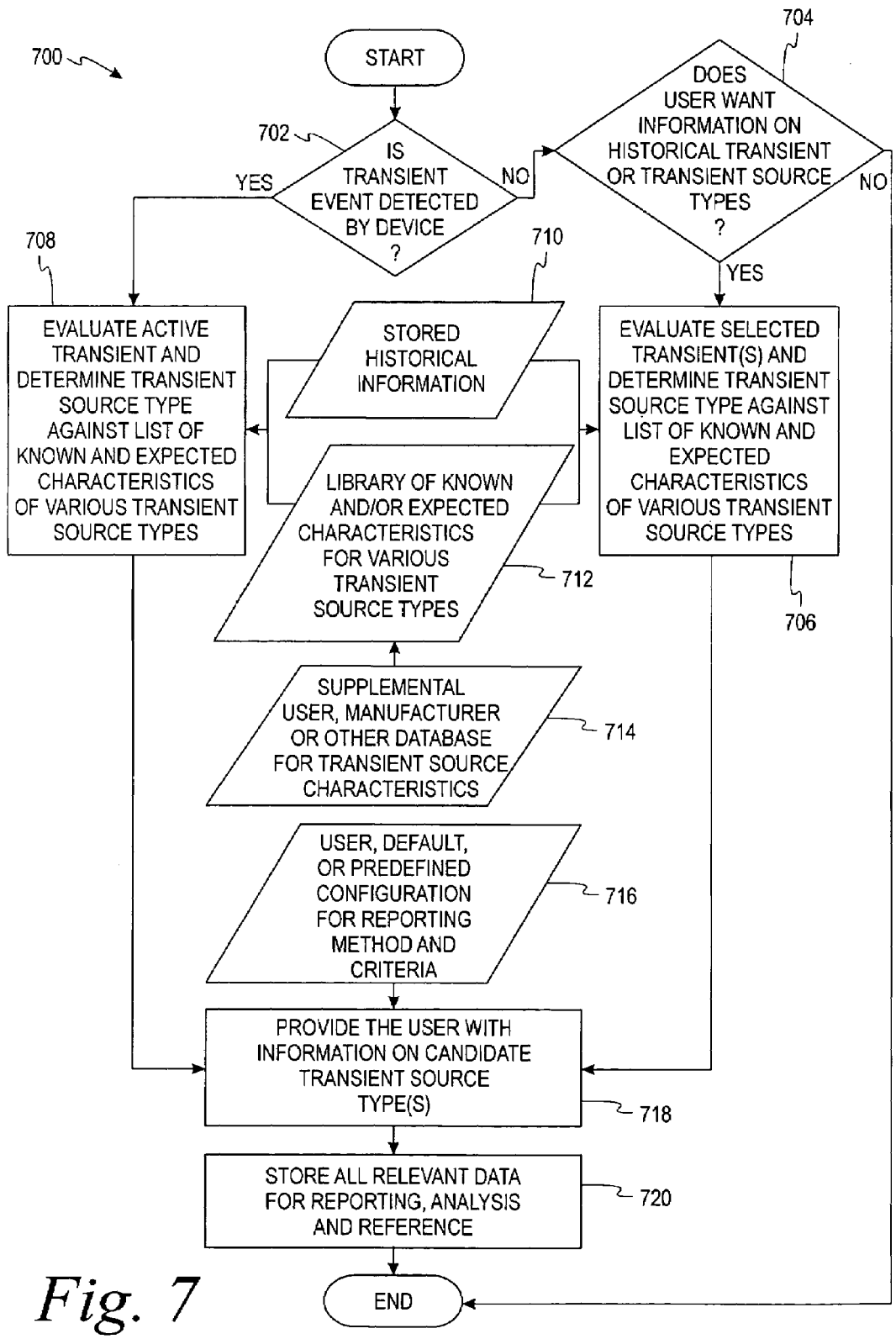
FIG. 7 is a flow chart diagram of a process for determining the source type of a detected transient.

FIG. 7 illustrates a flow chart of an algorithm 700 that determines the source type of a detected transient (414). This algorithm 700 is stored in the source type determination module 160 of the evaluation system 150. The algorithm 700 determines whether a transient event was detected by a monitoring device (702). If not, the user is presented with an option to view information about a particular historical transient(s) or transient source types (704). The transient(s) or transient selected by the user is evaluated and a transient source type is determined against a list of known and expected characteristics (such as those which appear in a Transient Evaluation Matrix like exemplary Table 1) of various transient source types. As mentioned above, conventional statistical correlation, histogram, and simple comparison methods may be employed to determine which transient source type best correlates with the selected transient(s). For example, a user may request that the evaluation system 150 determine the transient source type of a transient that occurred recently. The user selects that transient, and the algorithm 700 determines, through statistical correlation, and the like, which transient source type most likely corresponds to the selected transient. The algorithm 700 draws upon a database 710 of stored historical information and a library 712 of known characteristics and/or expected characteristics for various transient source types. The library 712 can be supplemented by user, manufacturer, or other database data 714 containing transient source characteristics. A threshold confidence level can be programmed into the algorithm 700 or selected by the user to set the level of correlation desired.

In still another example, the user may request information about a range of historical transients (704), and the algorithm 700 determines whether a single source may be causing these transients. To do so, the algorithm 700 consults the stored historical information 710 and the library of known and/or expected transient-source-type characteristics 712, and through statistical correlation, histogram algorithms, simple comparisons, or the like, determines, to a certain degree of confidence, which transients appear to be associated with each other and whether the transients are or are not likely caused by a single source.

When a transient event is detected by a monitoring device (702), the algorithm 700 evaluates the active transient and determines, using the conventional methods described above, the type of source of the transient against a list of known and expected characteristics of various transient source types (708). For example, one source type might be lightning, and known characteristics describing this source type may be stored in the library 712 or added to it by the user. Additionally, expected characteristics of this source type may be stored in the library 712. Historical information concerning other transient events caused by lightning are stored in the database 710. When a transient hits the system 100, it is characterized and those characteristics are compared against the known and expected transient source types. When a strong correlation with a particular source type is found, say lightning, the algorithm 700 reports that the transient source type is likely lightning (718). Optionally, the algorithm 700 can also report its confidence expressed, for example, as a percentage of certainty. The manner of reporting and criteria to be used in reporting the results to the user can be user-defined, default, or predefined in accordance with a reporting configuration database 716. The information as to the transient source type is presented to the user according to the reporting configuration information stored in the database or memory 716.

The algorithm 720 stores the relevant data for reporting, analysis, and future reference. That data includes the characteristics associated with the transient, the source type of the transient, the confidence level in the identification of the transient source type, and any updates or changes to the database 710, library 714, or supplemental database 716, and the dates of prior queries have been run on the database 710, library 714, or supplemental database 716.

Figure 8A:
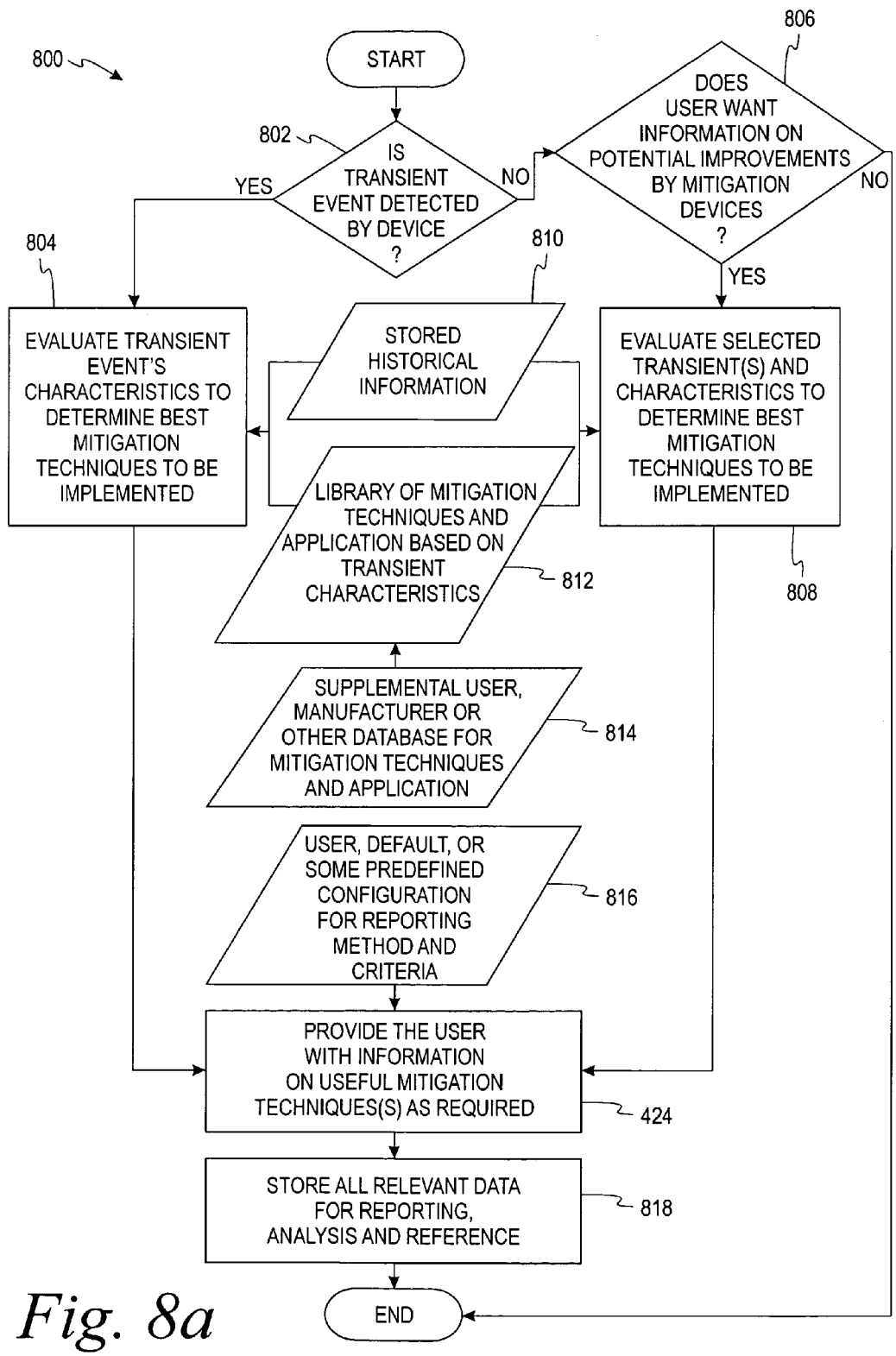
FIG. 8A is a flow chart diagram of a process for determining the best mitigation technique for suppressing or eliminating the effects of active or historical transients.

FIG. 8A is a flow chart of a mitigation determination algorithm 800 that determines the best mitigation technique for suppressing or eliminating the effects of active transients or recommending techniques for suppressing or eliminating historical transients. This algorithm 800 can be stored in the mitigation analyzer module 164 of the evaluation system 150. The algorithm 800 determines whether a transient event was detected by a monitoring device (802). If not and the user has indicated a desire for information on potential improvements by mitigation devices (806), the algorithm evaluates the characteristics of the transient(s) selected by the user to determine the best mitigation techniques to be implemented (808). To do so, the algorithm 800 draws upon stored historical information in database 810 and a library 812 of mitigation techniques and applications for a given set of transient characteristics. This library 812 can be supplemented by user, manufacturer, or other database 816 information containing mitigation techniques and applications. For example, for a selected combination of transient characteristics, the library 812 may suggest, based on the historical information database 810, that a surge protective device (SPD) be installed on a piece of equipment that is the likely source of a transient event. Information like this is provided to the user according to user-defined, default, or predefined configuration information 816 for reporting and according to the criteria to be used for such reporting. For example, when the hierarchical layout of the power system 100 is known, the user can be presented with a graphical layout of the power system, along with a graphical representation of the mitigation device over the location on the layout where it should be installed along with a graphical representation of the equipment that is likely the source of the transient. The evaluation system 150 can then determine how effective the mitigation device was and data representing its effectiveness or non-effectiveness can be stored to build up a historical database. In addition, the evaluation system 150 can predict the effectiveness of installing a particular mitigation device. These aspects are described in more detail in FIG. 8B.

If a monitoring device detects a transient event (802), the algorithm 800 evaluates the characteristics of the transient event and determines the best mitigation technique(s) to be implemented (804). Here, the algorithm 800 draws upon the same database 810 and library 812 (which is optionally supplemented by the supplemental database 814) to correlate the transient characteristics signature with known or historical signatures and the corresponding mitigation techniques that can effectively reduce or eliminate the effect of that (and perhaps other) particular transient source type.

Figure 8B:
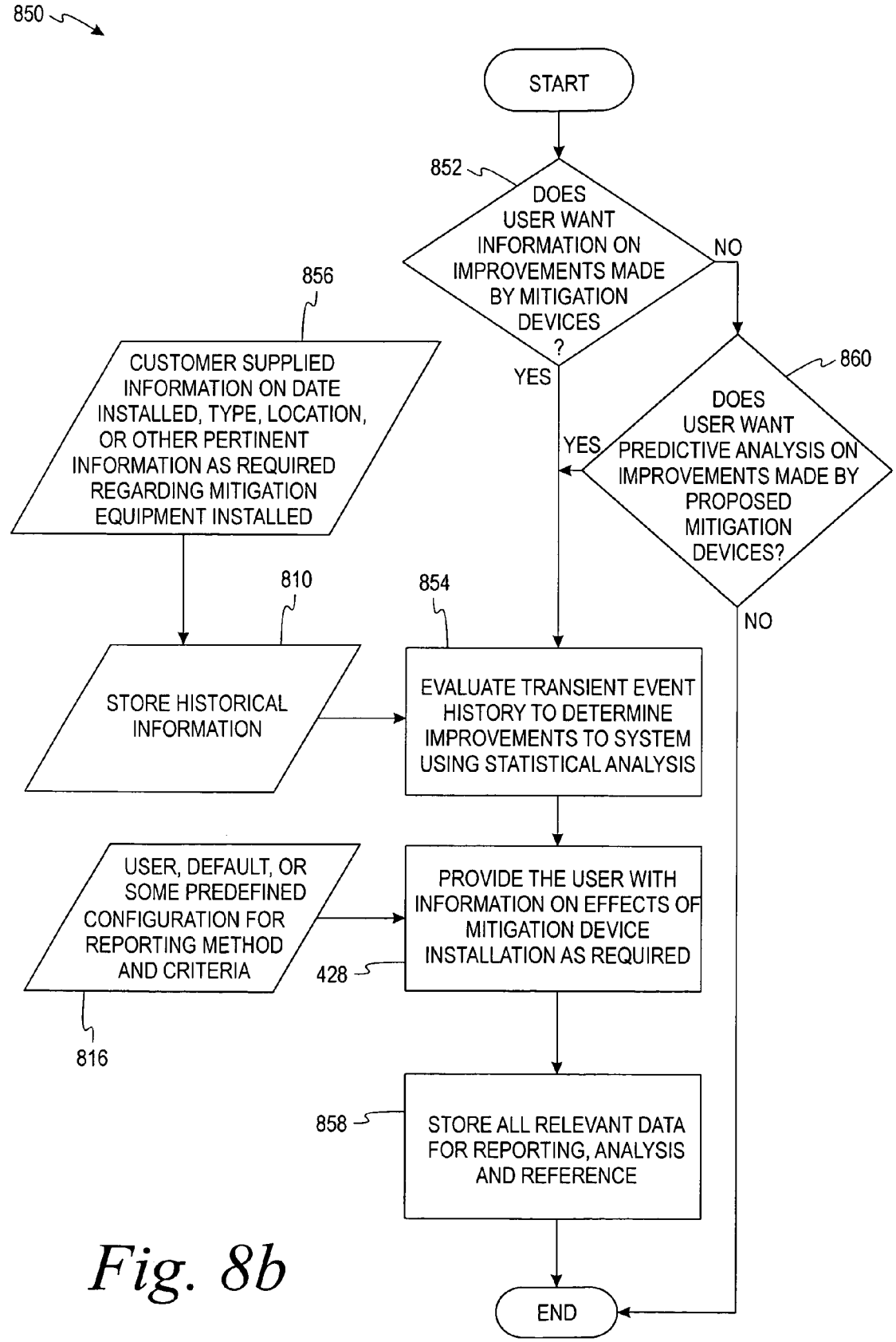
FIG. 8B is a flow chart diagram of a process for determining how effective a suggested installed mitigation device was on reducing or eliminating a transient source type.

FIG. 8B is a flow chart of a mitigation effectiveness algorithm 850 that determines how effective a suggested installed mitigation device was on reducing or eliminating a transient source. Like the algorithm 800, this algorithm 850 is stored in the mitigation analyzer module 164. This algorithm 850 queries whether the user wants information on whether a particular mitigation device improved the system's response to a transient event (852). If not, the algorithm 850 queries whether the user wants a predictive analysis on improvements made by the proposed mitigation devices (860). If either query (852, 580) is answered in the affirmative, the algorithm 850 evaluates the history of a transient event to determine improvements to the power system 100 using statistical analysis, histograms, or simple comparison techniques (854). To do so, the algorithm 850 consults the database of 810 of stored historical information (concerning transient events and their corresponding characteristics) and a database 856 of customer-supplied information on the date of installation, type, location, and other pertinent information as required regarding the mitigation equipment that was installed. For example, the algorithm 850 makes a determination that a mitigation device caused an overall improvement when a comparison of the historical effects of a transient event are improved compared to those effects after the mitigation device was installed. A threshold can be set by the user or automatically set by the system 150 to quantify the level of improvement necessary before an overall improvement is reported to the user.

The user is provided with information on the effects of the mitigation device that was installed (428) according to user-defined, default, or predefined configuration information 816 for reporting and according to the criteria to be used for such reporting. The user can also be provided with a prediction as to the effectiveness of the mitigation device. This prediction can be based upon the confidence level by the evaluation system 150 of the transient location, the transient source type, and/or the suggested mitigation device. All relevant data concerning the mitigation device, its ameliorative effects, if any, and updates to the historical information database 810 are stored (858).

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of determining the location of a transient event in an electrical system having a plurality of monitoring devices arranged at multiple locations in a hierarchy of the electrical system, comprising:
    automatically determining the hierarchy of the monitoring devices;
    storing a representation of the hierarchy of the monitoring devices, the hierarchy indicating how the monitoring devices are linked to one another;
    detecting the occurrence of the transient event at a plurality of monitoring devices arranged at the multiple locations in the electrical system;
    measuring, in at least some of the monitoring devices, at least one characteristic of the transient event; and
    automatically determining the location in the hierarchy of the source of the transient event based on a comparison of the at least one characteristic measured by each of the at least some monitoring devices and their respective positions in the hierarchy.

2. A computer readable medium encoded with instructions for directing a controller to perform the method of claim 1.

3. The method claim 1, further comprising:
    measuring an electrical parameter of the transient event; and
    determining a characteristic of the transient event based on the measured electrical parameter.

4. The method of claim 3, wherein the electrical parameter is at least one of voltage, amperage, percentage, time, frequency(s), number of occurrences, rate of change, polarity, date, phase angle, energy, effected conductor(s), shape or location.

5. The method of claim 3, wherein the characteristic is at least one of peak amplitude, rise time, time of occurrence, periodicity of occurrence, frequency components, initial polarity, decay time, total duration, phase angle, energy, shape, affected conductors, cumulative energy or location.

6. The method of claim 3, further comprising:
    selecting a transient mitigation device based on the characteristic of the transient event; and
    installing the transient mitigation device in the electrical system.

7. The method of claim 6, further comprising evaluating the effectiveness of the transient mitigation device based on a characteristic of a subsequent transient event.

8. The method of claim 3, further comprising:
    measuring additional electrical parameters of the transient event; and
    determining additional characteristics of the transient event based on the additional measured electrical parameters.

9. The method of claim 8, further comprising determining the type of the transient event based on the additional characteristics.

10. The method of claim 3, further comprising assigning the transient event to a predetermined category of transient events based on the additional characteristics.

11. The method of claim 10, wherein the category of transient events is determined by collecting characteristics data from prior transient events.

12. A transient evaluation system to determine the location of a transient event in an electrical system having a plurality of monitoring devices arranged at multiple locations in a hierarchy of the electrical system, the transient evaluation system comprising:
    a memory that stores a representation of the hierarchy of the monitoring devices, the hierarchy indicating how the monitoring devices are linked to one another;
    a plurality of monitoring devices electrically coupled to the electrical system, each of the monitoring devices measuring the respective magnitude of the transient event;
    a controller in communication with the plurality of the monitoring devices; and
    wherein the controller automatically determines the hierarchy of the electrical system and automatically determines the location in the hierarchy of the source of the transient event based on the highest magnitude of the transient event measured by the plurality of monitoring devices and their respective positions in the hierarchy.

13. The transient evaluation system of claim 12, wherein the electrical system has a hierarchy of the plurality of monitoring devices and wherein the controller determines the location of the transient event by referencing the monitoring device measuring the highest magnitude with the hierarchy of the plurality of monitoring devices.

14. The transient evaluation system of claim 12, wherein at least one of the plurality of measuring devices measures an electrical parameter of the transient event; and wherein the controller determines a characteristic of the transient event based on the measured electrical parameter.

15. The transient evaluation system of claim 14, wherein the electrical parameter is at least one of voltage, amperage, percentage, time, frequency(s), number of occurrences, rate of change, polarity, date, phase angle, energy, effected conductor(s), shape or location.

16. The transient evaluation system of claim 14, wherein the characteristic is at least one of peak amplitude, rise time, time of occurrence, periodicity of occurrence, frequency components, initial polarity, decay time, total duration, phase angle, energy, shape, affected conductors, cumulative energy or location.

17. The transient evaluation system of claim 14, wherein the controller selects a transient mitigation device for installation in the electrical system based on the characteristic of the transient event.

18. The transient evaluation system of claim 17, wherein the controller evaluates the effectiveness of the transient mitigation device based on a characteristic of a subsequent transient event.

19. The transient evaluation system of claim 14, wherein the at least one of the plurality of monitoring devices measures additional electrical parameters of the transient event; and wherein the controller determines additional characteristics of the transient event based on the additional measured electrical parameters.

20. The transient evaluation system of claim 19, wherein the controller determines the type of the transient event based on the additional characteristics.

21. The transient evaluation system of claim 19, wherein the controller assigns the transient event to a predetermined category of transient events based on the additional characteristics.

22. The transient evaluation system of claim 19, further comprising a memory device storing the additional characteristics.

23. The transient evaluation system of claim 22, wherein the memory device stores the additional characteristics as a category according to a range of values in a matrix.

* * * * *